(12) United States Patent
Chapel et al.

(10) Patent No.: US 9,793,887 B2
(45) Date of Patent: Oct. 17, 2017

(54) SOLID STATE RELAY

(71) Applicant: Zonit Structured Solutions, LLC, Boulder, CO (US)

(72) Inventors: Steve Chapel, Iliff, CO (US); William Pachoud, Boulder, CO (US)

(73) Assignee: ZONIT STRUCTURED SOLUTIONS, LLC, Boulder, CO (US)

( * ) Notice: Subject to any disclaimer, the term of this patent is extended or adjusted under 35 U.S.C. 154(b) by 484 days.

(21) Appl. No.: 14/217,179

(22) Filed: Mar. 17, 2014

(65) Prior Publication Data

US 2015/0054356 A1    Feb. 26, 2015

Related U.S. Application Data

(60) Provisional application No. 61/792,576, filed on Mar. 15, 2013.

(51) Int. Cl.
| | |
|---|---|
| *H03K 17/13* | (2006.01) |
| *H03K 17/687* | (2006.01) |
| *H05K 3/30* | (2006.01) |
| *H05K 1/18* | (2006.01) |
| *H05K 5/00* | (2006.01) |
| *H05K 1/02* | (2006.01) |

(52) U.S. Cl.
CPC ......... *H03K 17/133* (2013.01); *H03K 17/687* (2013.01); *H05K 1/0204* (2013.01); *H05K 3/306* (2013.01); *H05K 2201/042* (2013.01); *H05K 2201/066* (2013.01); *H05K 2201/10053* (2013.01); *H05K 2201/10242* (2013.01); *H05K 2201/10303* (2013.01); *H05K 2201/10363* (2013.01); *H05K 2201/2036* (2013.01); *Y10T 29/4913* (2015.01); *Y10T 307/937* (2015.04)

(58) Field of Classification Search
None
See application file for complete search history.

(56) References Cited

U.S. PATENT DOCUMENTS

| | | | |
|---|---|---|---|
| 6,060,788 A * | 5/2000 | Carlson | B60R 16/005 307/10.8 |
| 2010/0007403 A1* | 1/2010 | Ness | G01K 1/16 327/512 |

* cited by examiner

*Primary Examiner* — Carlos Amaya
*Assistant Examiner* — Aqeel Bukhari
(74) *Attorney, Agent, or Firm* — Marsh Fischmann & Breyfogle LLP; Kent A. Fischmann

(57) ABSTRACT

A compact solid state relay (7) is provided. Solid state devices (74, 75), such as Triacs or Thyristors are used to implement the relay functionality. The device is at least partially enclosed in a housing that has pins for mounting on an electronics board. A number of "U" shaped jumpers (72) or other jumpers or wires are provided in the housing to act as heat sinks. A subminiature fan (70) is positioned to create an air flow over the heat sinks and dissipate heat from the device.

20 Claims, 6 Drawing Sheets

SOLID STATE RELAY

CROSS-REFERENCES

This application is a nonprovisional of U.S. patent application No. 61/792,576, entitled, "SOLID STATE RELAY," filed Mar. 15, 2013, the contents of which are incorporated herein by reference as set forth in full and priority from this application is claimed to the full extent allowed by U.S. law.

The following applications are incorporated by reference herein, though no priority claim is made:
1) U.S. Patent Application Publication No. US-2012/0181869-A1, published on Jul. 19, 2012, entitled, "PARALLEL REDUNDANT POWER DISTRIBUTION," U.S. patent application Ser. No. 13/208,333, filed on Aug. 11, 2011, entitled, "PARALLEL REDUNDANT POWER DISTRIBUTION," which is a nonprovisional of and claims priority from U.S. Provisional Patent Application No. 61/372,752, filed Aug. 11, 2010, entitled "HIGHLY PARALLEL REDUNDANT POWER DISTRIBUTION METHODS," and U.S. Provisional Patent Application No. 61/372,756, filed Aug. 11, 2010, entitled "REDUNDANT POWER DISTRIBUTION,"
2) U.S. Pat. No. 8,004,115 from U.S. patent application Ser. No. 12/569,733, filed Sep. 29, 2009, entitled AUTOMATIC TRANSFER SWITCH MODULE, which is a continuation-in-part of U.S. Pat. No. 12/531,212, filed on Sep. 14, 2009, entitled "AUTOMATIC TRANSFER SWITCH,", which is the U.S. National Stage of PCT Application US2008/57140, filed on Mar. 14, 2008, entitled "AUTOMATIC TRANSFER SWITCH MODULE," which claims priority from U.S. Provisional Application No. 60/894,842, filed on Mar. 14, 2007, entitled "AUTOMATIC TRANSFER SWITCH MODULE;" and
3) U.S. Patent Application Publication No. US-2012-0092811 for U.S. patent application Ser. No. 13/108,824, filed on May 16, 2011, entitled "POWER DISTRIBUTION SYSTEMS AND METHODOLOGY," is a continuation of U.S. patent application Ser. No. 12/891,500, filed on Sep. 27, 2010, entitled, "Power Distribution Methodology" which is a continuation-in-part of International Patent Application No. PCT/US2009/038427, filed on Mar. 26, 2009, entitled, "Power Distribution Systems And Methodology," which claims priority from U.S. Provisional Application No. 61/039,716, filed on Mar. 26, 2008, entitled, "Power Distribution Methodology."

FIELD

Embodiments of the present invention relate to the use of small form factor solid state relays in various contexts and providing innovative methods to allow them to be incorporated into the design of small form factors devices where space is limited and the shedding of the heat inherent to solid state relays is a significant issue. These types of issues arise in the design of devices that are used in the design and operation of data centers and, in particular, to devices used in the distribution of power including such distribution in mission critical equipment used in such environments as medical contexts, the power utility grid or in data center environments.

BACKGROUND

Numerous products in the electronic marketplace utilize industry standard relays in small form factor packages. An example relay of such type is referred to as the G2RL footprint, among other trade names. These small form factor footprints allow compact deployment of a variety of medium power relays on Printed Circuit Boards (PCB) in a manner that is efficient in volumetric deployment, and has pin spacing at or very near the practical limits to be Agency accepted. Specifically, "Agency" refers to Underwriters Laboratories, or UL, and/or any other approving agencies concerned with PCB copper trace placement and spacing. This miniature relay interconnection layout, being common within the industry is applicable to a wide variety of electro-mechanical relay combinations. In some applications, the use of Solid State Relays (SSR) is desirable.

However, the use of SSRs in this miniature footprint has been restricted to build-as-you-go methodology, and no defined package for a SSR in this format has been developed or recognized due to a simple problem - dissipating heat. In a traditional electro-mechanical relay of this size, very little heat is generated, due to the mechanical contacts having very little resistance. Typical heat generation by-product numbers are less than a Watt when the electro-mechanical version is passing its rated power. The rated power of the example G2RL relays that are used as an example case in this invention would typically be 6 Amps at 240 Volts. In addition, these relays are often in one of three configurations. Industry references are Form A, Form B and Form C. Forms A and B are simply two contacts either connected together by activation or the relay, (Form A), two contacts either dis-connected from each other by activation or the relay, (Form B), Or three contacts, one of which is a common that is disconnected from one of the other contacts, and connected to the third contact when activated (Form C). Of these, this invention applies to all three forms, but is of primary concern to the third, the Form C variety, as it is the most complex of the three varieties.

SUMMARY

The present invention relates to providing methods to allow the use of small form factor SSR relays in various contexts, including in data center environments. This can be an important issue because of the difference in the transfer time of standard mechanical contact relays vs. solid-state relays, which are much faster. Mechanical relays are usually constructed with the contacts mounted (usually on an armature) so that they can be moved to accomplish their switching function. The contact mass, shape, range of motion, mechanical leverage and force used to move the armature are all relay design issues. The range of motion is dictated by the gap needed between the contacts to minimize arcing at the maximum design current level and voltage rating. As the maximum design current is increased, the gap must also increase. The mass of the contact must be accelerated by the force applied to the armature, which has a practical limit. These factors impose a limit on the amount of current that can be sent through a pair of contacts in a mechanical relay and still maintain an acceptable transfer time for EDP equipment. EDP equipment CBEMA guidelines recommend a maximum of approximately 20 milliseconds of power outage for continued operation of modern switched power supplies. If the mass of the armature and contact gap are too large, the relay transfer time exceeds this time limit.

Solid State Relays do not have the transfer time limitations of mechanical relays, they have transfer times that are generally faster than traditional mechanical relays. However, they are less efficient, they waste approximately 1-3% of the current that flows through them as heat, which is much more than traditional mechanical relays waste.

The invention relates to providing improved packaging methods for SSR relays which allows them to be used in place of traditional standard small form-factor mechanical relays in a variety of contexts. They can be used in the design of automatic transfer switches (ATS), for switching between two or more power sources (e.g., due to power failures such as outages or power quality issues), as well as other power distribution components. Some of the objectives of the invention include the following:

Providing methods to enable the of use of small form factor SSD relays in the place of traditional standard small form-factor mechanical relays, particularly in devices that have small form factors and therefore have not used such SSD relays due to issues with disposing of the extra waste heat that SSD relays produce relative to traditional mechanical relays of the same rated capacity;

Providing methods to efficiently dispose of the additional waste heat; and

Providing options to design engineers to cost-effectively use the invention in existing designs.

These objectives and others are addressed in accordance with the present invention by providing various systems, components and processes for improving SSD relay packaging and deployment options. Many aspects of the invention, as discussed below, are applicable in a variety of contexts. However, the invention has particular advantages in connection with data center applications. In this regard, the invention provides considerable flexibility in designing devices that are used in power distribution and control in data center environments. The invention is advantageous in designing the devices used in power distribution to server farms such as are used by companies such as Google or Amazon or cloud computing providers.

In accordance with one aspect of the present invention, a method and apparatus ("utility") is provided for a switching power. The utility involves implementing a relay on a printed circuit board. The relay is operative for switching power between a first contact associated with the first circuit and a second contact. The relay is mounted on a housing structure for at least partially enclosing the relay. Multiple heat sink elements are provided within the housing for dissipating heat generated by the relay in operation. For example, the heat sink elements may comprise "U" shaped jumpers formed from a heat conducting material or other jumpers or wires extending between opposite sides of the housing. The utility further includes a fan position for producing air flow across the heat sink elements. In a preferred implementation, a sub-miniature fan is mounted on the housing to generate the air flow.

The invention disclosed can also be incorporated in a variety of apparatus, for example such as described in U.S. patent application Ser. No. 13/108.824, filed on May 16, 2011, entitled, "POWER DISTRIBUTION METHODOLOGY." This allows the creation of auto-switched power distribution methods that incorporate auto-switching as an integrated feature of the power distribution methodology.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

Figure 1:
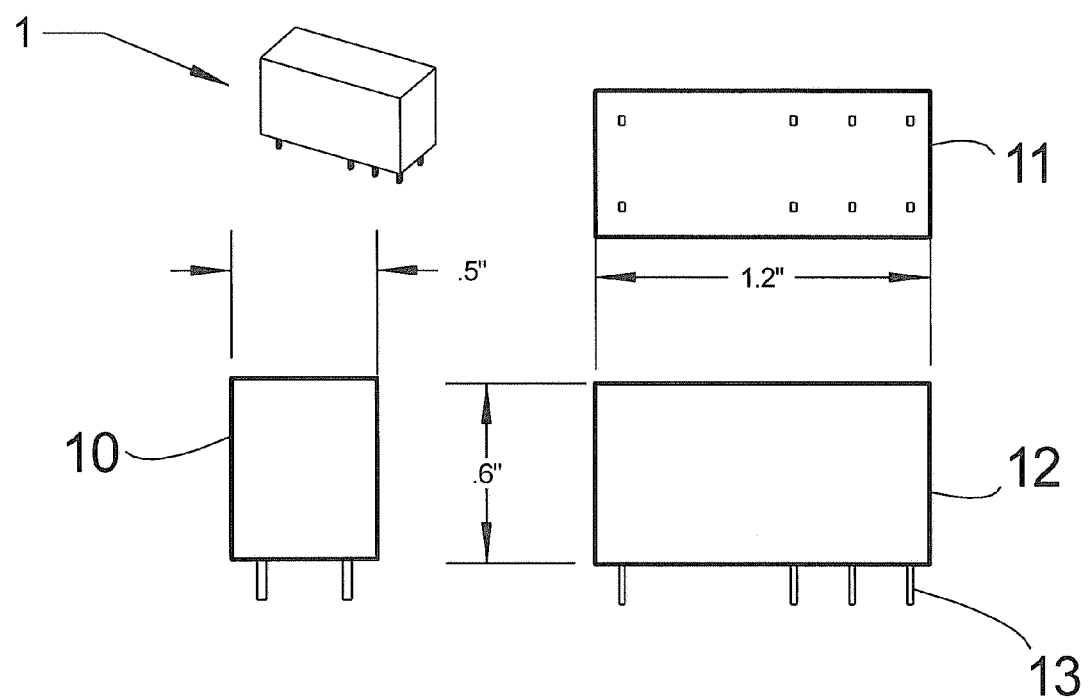
FIG. 1 shows a example of a typical G2RL mechanical relay as referenced in the discussion of the invention.

FIG. 1 depicts the mechanical outline of a traditional electro-mechanical relay of the example G2RL footprint. It should be noted that various footprints in this size category are possible, and this representation is not restricted to this exact combination of size and dimensions. Observing FIG. 1, the dimensions of the package can be observed and envisioned as miniature with respect to many available electro-mechanical relays on the market. The overall package size of 1.2 inch by 0.6 inch by 0.5 inch is in the reasonably compact category for power control relays. This package size is used extensively in industry, and in particular, in the system described in U.S. Pat. No. 8,004,115, issued on Aug. 23, 2011, entitled, "AUTOMATIC TRANSFER SWITCH MODULE."

FIG. 1 depicts an orthogonal view (1) of the referenced relay package with end view (10), side view (12), top view (11), and a typical pin (13), often in various combinations of placement on the bottom of the relay, but generally with a pitch of 0.2 inch with respect to other pins. The relay shown is of the Form C mentioned earlier. The relay depicted in FIG. 1 also has two sets of Form C contacts.

Figure 2:
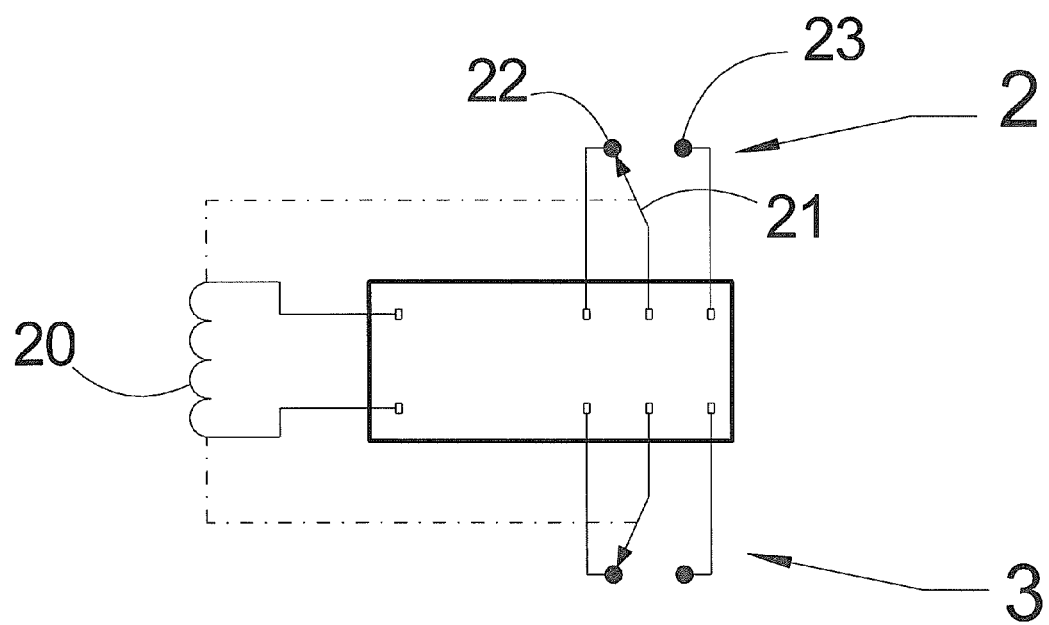
FIG. 2 shows the electrical configuration of a typical G2RL mechanical relay.

FIG. 2 shows the electrical configuration of this relay:

It shows one set of the Form C contacts (2), with the parallel set (3). The Common contact (21), the Normally Closed (NC) contact (22) and the Normally Open (NO) contact (23). A coil (20) is utilized to change the position of the two common contacts simultaneously.

Figure 3:
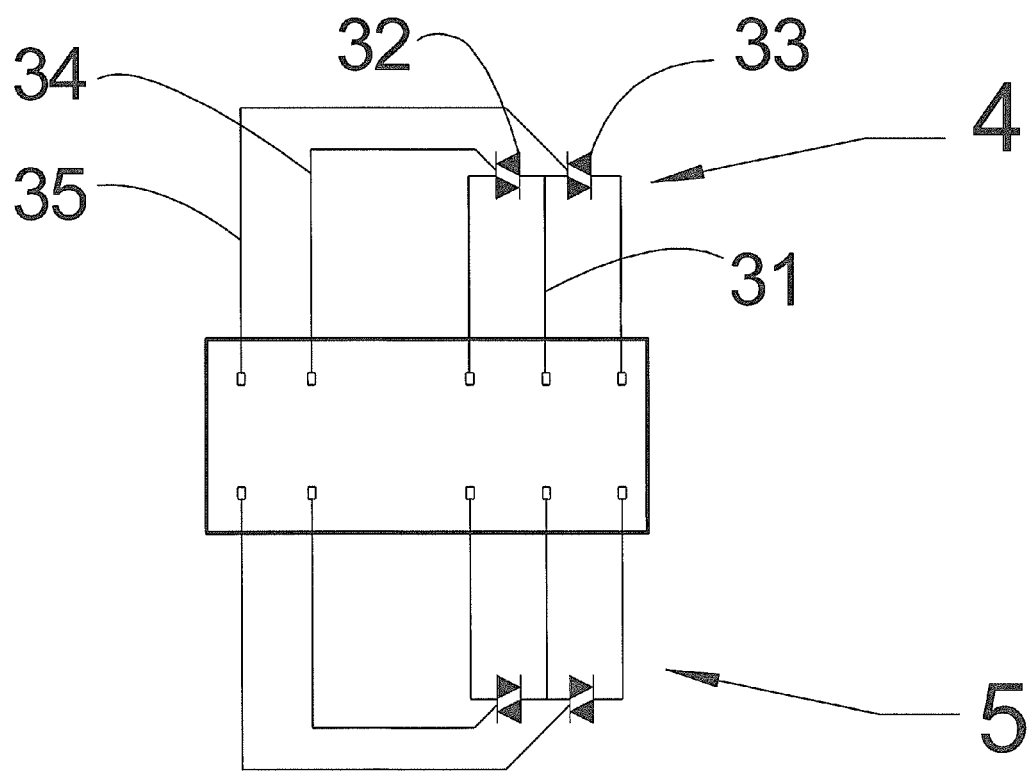
FIG. 3 shows an example G2RL SSD relay in accordance with the invention.

FIG. 3 depicts the same relay with the schematic representation of the Solid State Relay components. FIG. 3 shows a schematic representation of the desired configuration referenced in this invention with the four semiconductor Alternating Current (AC) control switches often called Triacs (32, 33), or Thyristors. These semiconductor devices essentially replace the contacts found in a traditional AC switching applications. In addition, the traditional coil is replaced with a control wire on each of the Triacs (32, 33) called a Gate. These Gates (34, 35) are now connected to pins on the bottom of the Relay assembly.

Switch pair (4) is the equivalent to one of the Form C contacts mentioned in the traditional electro-mechanical relay, and switch pair (5) is the equivalent of the second of the Form C contacts mentioned in the traditional electro-mechanical relay.

The principal limitation of the SSR is the heat generated. Solid State semiconductors including, but not limited to, triacs have a typical voltage drop across the two power conduction terminals of about 1.2 Volts. This means that when current is running through the semiconductor, the semiconductor is dissipating power at a rate of about the current times the voltage drop, or, in the example relay case of 6 Amps, 6 Amps times 1.2 Volts, or 7.2 Watts. This is not a great amount of heat, but in the confined space of the package dimensions of the desired embodiment of this patent, it is very difficult to dissipate. The example presented here allows an easily manufactured means of dissipating that heat, thus enabling the manufacture of the SSR in miniature form factors for universal replacement and use in place of the electro-mechanical varieties. This is desirable to enable faster actuation times, and better control of the timing of the admittance of current through the relay(s).

Figure 4:
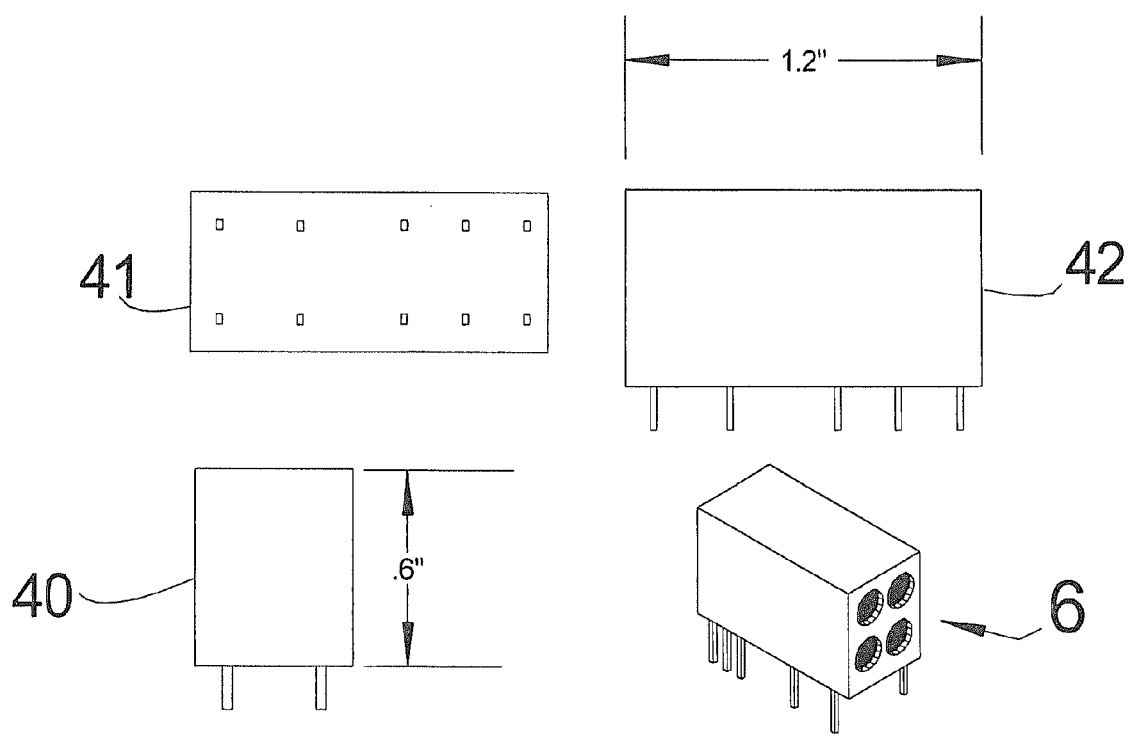
FIG. 4 illustrates a mechanical cross-section of an example G2RL SSD relay in accordance with the invention.

FIG. 4 depicts a mechanical layout cross section of a preferred embodiment of the invention:

In FIG. 4, it should be noted the overall mechanical dimensions of the package are the same as in the example provided for the miniature electro-mechanical equivalent. Of notable exception are two additional electrical mounting and conductors for the additional gate controls mentioned, and apertures at the ends of the relay (6) to allow heat to be expelled via air circulation.

Figure 5:
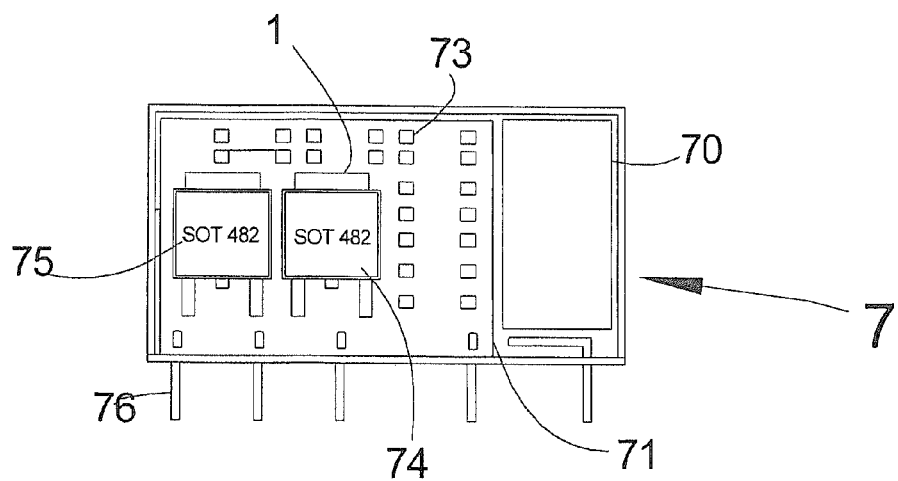
FIG. 5 depicts a cross section of an example G2RL relay discussed in accordance with the invention.
Figure 5:
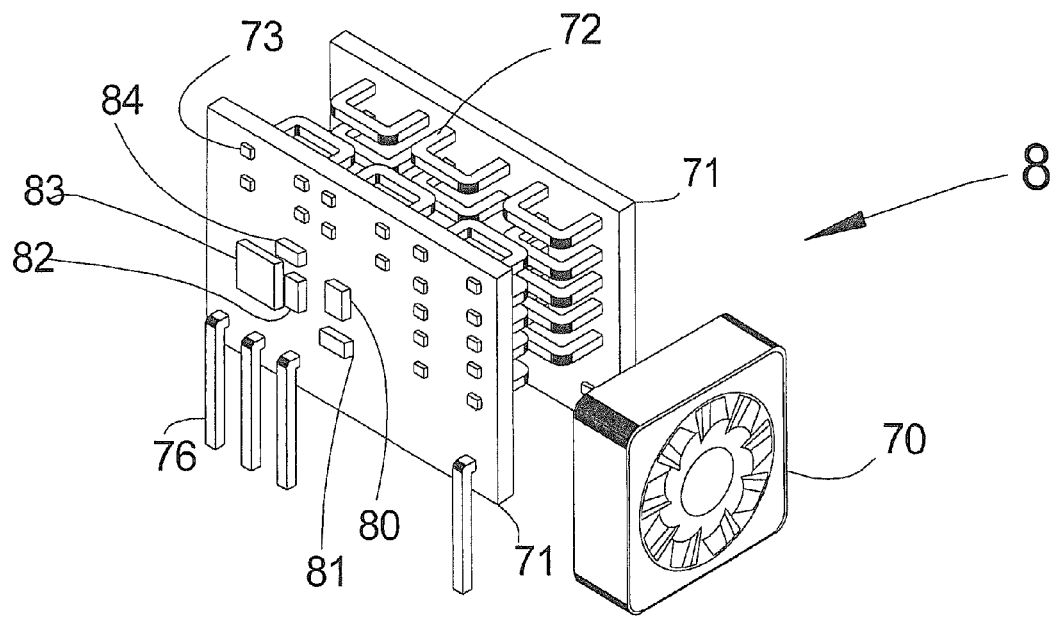

FIG. 5 depicts a cross section of the example relay discussed in accordance with this invention. It depicts the cross section (7) and orthogonal (8) views of a preferred embodiment of this invention. Observing the cross section the principal components of the SSR can be seen. As mentioned before, for each Form C switch equivalent, a pair of Solid State devices (74, 75), such as triacs or thyristors, are used. The device package preferred for these Solid State devices is the JDEC SOT482 package style, although it is possible to use other equivalent or nearly equivalent size packages. Also shown is a critical component, a fan (70). These sub-miniature fans are now commercially available in a package size of 10 mm by 8 mm by 3 mm, from various manufacturers. The ultra-miniature size of these mechanical fans allow the construction of this relay embodying the invention. Shown are copper "U" shaped jumpers (72) in numerous locations with the tips (73) of those jumpers (72) shown protruding through the Printed Circuit Board (71). The Solid State Switches (SSS) (74, 75) are surface mounted soldered to the interior surfaces of the PCBs (71) and have contiguous copper from under those SSS devices to the solder in points of the jumpers (72). This copper trace is of a thickness selected to provide suitable heat transfer from the SSS devices (74, 75) to all of the jumpers (72) It should be noted that each PCB shown has a total of 9 such jumpers (72), but more or less could be utilized, as well as the placement of the components could be arranged for better PCB layout, or more efficient heat transfer. Air, circulated by the fan (70) is drawn or pushed across all of the components (74, 75, 80 to 84, 72) especially the jumpers (72) to remove heat.

One aspect of the invention consists of the novel application of currently available standard jumpers used in the machine production of PCB assemblies. Sufficient surface area can be acquired for very efficient cooling of the SSS devices (74, 75) by simply inserting the desired number of jumpers in various locations and possibly at various depths. The depth of insertion is a programmable item with modern automated assembly machines. Thus, the completed sub-assembly consisting of a PCB (71), electronic components (74, 75, 80 to 84) and multiple copies of heat sinking jumpers (72) can be accomplished in a single pass on an automated PCB assembly machine, a process often called "stuffing".

The final assembled relay can be covered by an injection molded cover, as shown in FIG. 3 (6) or left exposed without a cover for use in arrangements where the fan (70) is either replaced by, or supplemented with external cooling air moved by an external source.

Additional electronic components (80 to 84) are shown for a possible option that allows electronic control for the gate drive of the SSS devices (74, 75) such that only switching at the point where the applied AC voltage passes through zero volts on each half cycle. This so-called zero crossing control may be utilized to provide more contiguous and non-harmonic switching. An additional benefit, and possibly requirement will be that at no time can both SSS devices be turned on simultaneously. The additional electronic components (80 to 84) are also capable of being arranged in a manner that prevents this occurrence.

Figure 6:
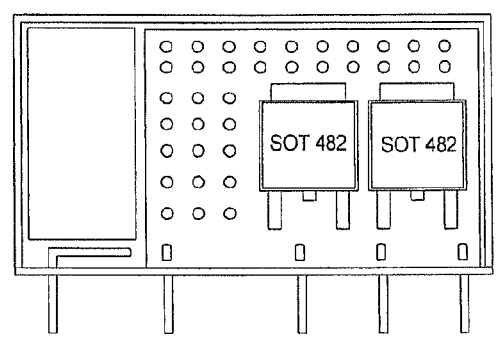
FIG. 6 depicts an alternate instantiation of the heat sinking jumpers in accordance with the invention.
Figure 6:
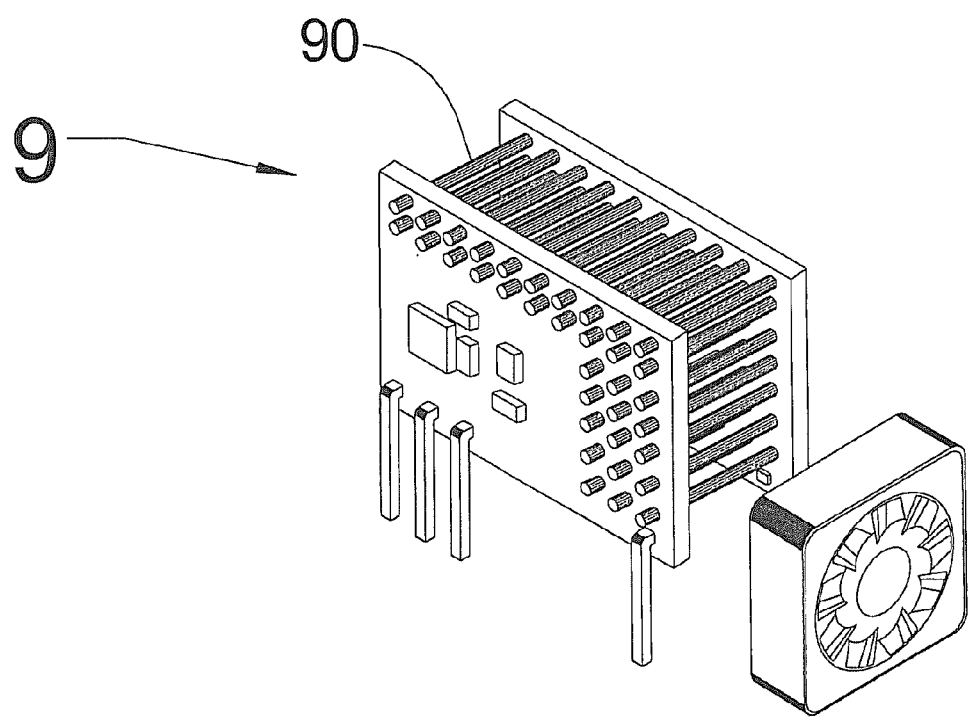

FIG. 6 depicts an alternate instantiation of the heat sinking jumpers. In FIG. 6, it can be observed that the jumpers referenced in FIG. 5 (72) have been replaced by jumpers (90) proceeding between the two main boards. This variation could be applied for applications where the electrical components of each of the two SSR semiconductor groups have common electrical potentials. This application could be utilized to construct a single Form C relay with double the current carrying capacity by sharing the current among two SSS devices, one of which is located on each of the board subassemblies. This configuration also utilized wire jumpers machine insertable, and does not require special heat sink sub-assemblies. In addition, the density of wire jumpers (preferably copper or aluminum), the placement of, and total number of can be selected to provide optimum heat transfer from the SSS devices to the air.

It should be noted that both the "U" shaped jumpers and straight jumpers described can have kinks, and other geometric variations to assist in improving their heat transfer efficiency.

The foregoing description of the present invention has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. The embodiments described hereinabove are further intended to explain best modes known of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

What is claimed:

1. A relay device, comprising:
   a relay, implemented on a printed circuit board, operative for switching power between a first contact associate with a first circuit and a second contact;
   housing structure for at least partially enclosing said relay;
   multiple heat sink elements for dissipating heat generated by said relay in operation, each of said heat sink elements comprising a jumper extending between first and second circuit board solder points; and
   a fan positioned for producing an air flow across said heat sink elements.

2. A relay device as set forth in claim 1, wherein said heat sink elements comprise "u" shaped jumpers formed from heat conducting material.

3. A relay device as set forth in claim 1, wherein said heat sink elements are formed from heat conducting material and extend between walls of said housing.

4. A relay device as set forth in claim 1, wherein said relay is implemented as solid state switches.

5. A relay device as set forth in claim 1, where said fan is mounted on said housing.

6. A relay device as set forth in claim 5, further comprising pins extending from said housing for mounting on an electronics board.

7. A relay device as set forth in claim 1, further comprising a controller for controlling said relay to switch power in synchronization with a phase of a power signal.

8. A method for use in constructing a relay, comprising:
forming a relay on a printed circuit board, said relay operative for switching power between a first contact associated with a first circuit and a second contact;
mounting said relay on a housing structure for at least partially enclosing said relay;
mounting multiple heat sink elements on said housing for dissipating heat generated by said relay in operation wherein said heat sink elements comprise jumpers and said mounting comprises soldering each said jumper at first and second circuit board solder points; and
positioning a fan so as to produce an air flow across said heat sink elements.

9. A method as set forth in claim 8, wherein said step of mounting multiple heat sink elements comprises operating a machine to insert said heat sink elements to a desired depth.

10. A method as set forth in claim 8, wherein said step of positioning a fan comprises mounting a fan on said housing.

11. A method as set forth in claim 8, wherein said relay includes pins extending from said housing and said method further comprises using said pins for mounting said relay on an electronics board.

12. A method as set forth in claim 8, further comprising operating a controller for controlling said relay to switch power and synchronization with zero crossings of a power signal.

13. A relay device, comprising:
a relay, implemented on a printed circuit board, operative for switching power between a first contact associate with a first circuit and a second contact;
housing structure for at least partially enclosing said relay;
multiple heat sink elements for dissipating heat generated by said relay in operation; and
a fan positioned for producing an air flow across said heat sink elements,
wherein said housing structure includes pins extending therefrom for enabling connections to said relay from an exterior of said housing structure and further having apertures formed in one or more surfaces thereof to allow heat to be expelled via air circulation.

14. A relay device as set forth in claim 13, wherein said heat sink elements comprise "u" shaped jumpers formed from heat conducting material.

15. A relay device as set forth in claim 13, wherein said heat sink elements are formed from heat conducting material and extend between walls of said housing.

16. A relay device as set forth in claim 13, wherein said relay is implemented as solid state switches.

17. A relay device as set forth in claim 13, where said fan is mounted on said housing.

18. A relay device as set forth in claim 17, wherein said pins extending from said housing are configured for mounting on an electronics board.

19. A relay device as set forth in claim 13, further comprising a controller for controlling said relay to switch power in synchronization with a phase of a power signal.

20. A relay device as set forth in claim 13, further comprising thermally conductive traces for connecting said relay to said multiple heat sink members.

* * * * *